United States Patent [19]
Harris et al.

[11] Patent Number: 5,794,454
[45] Date of Patent: Aug. 18, 1998

[54] COOLING DEVICE FOR HARD TO ACCESS NON-COPLANAR CIRCUIT CHIPS

[75] Inventors: Willard Stephen Harris, Red Hook; Randall Gail Kemink, Poughkeepsie; William David McClafferty, New Paltz; Roger Ray Schmidt, Poughkeepsie, all of N.Y.

[73] Assignee: International Business Machines Corporation, Armonk, N.Y.

[21] Appl. No.: 760,618

[22] Filed: Dec. 4, 1996

[51] Int. Cl.⁶ .......................... F25D 23/12; F28D 15/00
[52] U.S. Cl. ............................ 62/259.2; 165/104.21; 165/104.33; 361/700
[58] Field of Search ................ 62/259.2; 165/104.33, 165/104.21, 104.11, 104.19; 361/677, 689, 700–807

[56] References Cited

U.S. PATENT DOCUMENTS 4,930,317  6/1990  Klein ........................... 62/3.3
5,343,358  8/1994  Hilbrink ....................... 361/700
5,343,940  9/1994  Jean ............................ 165/104.33
5,353,192  10/1994 Nordin ......................... 361/700
5,409,055  4/1995  Tanaka et al. ................ 165/104.33
5,413,167  5/1995  Hara et al. ................... 165/85

*Primary Examiner*—William Doerrler
*Attorney, Agent, or Firm*—Lawrence D. Cutter

[57] ABSTRACT

Heat pipes are employed in conjunction with flexible flap thermal conductors to provide a mechanism for cooling high-powered electronic circuit chip modules which cannot otherwise be cooled by conventional means because of their non-coplanarity and their inaccessibility. More particularly, the present invention provides a mechanism for cooling electronic circuit chip modules which are disposed on circuit boards which are in close proximity to one another which fact precludes air cooling of heat sink structures and/or the imposition of a liquid-cooled cold plate due to the non-coplanarity and/or due to the inaccessibility.

8 Claims, 1 Drawing Sheet

COOLING DEVICE FOR HARD TO ACCESS NON-COPLANAR CIRCUIT CHIPS

BACKGROUND OF THE INVENTION

The present invention is generally directed to cooling devices and methods for electronic circuit chips. More particularly, the apparatus and method of the present invention are directed to cooling electronic chips or modules that are hard to access and which generally exhibit non-coplanar properties.

Electronic circuit modules or chips are frequently attached to planar boards using solder columns or solder balls. These modules, boards and solder attachments all have dimensional tolerances associated with them, and in many cases, multiple module package types and sizes are mounted on the same board. These tolerances and package type and/or package size variations result in the top surface of the module being non-coplanar. In electronic circuit applications where module power levels are low, variable package size and dimensional tolerance have little or no impact on the cooling system which is typically provided by forced air with individual module heat sinks where necessary. However, in certain situations where a module on a board cannot be adequately cooled by conventional air cooling, because of high module power levels, there is the additional complicating factor that the module's top surfaces, where a liquid cooling system would be typically attached, are not coplanar. Furthermore, in such systems, there is often an additional problem in that the ultimate heat sink is relatively remote with respect to the heat source. Thus, there exists situations in which conventional heat sinks cannot be employed because of the proximity of the circuit boards. Furthermore, liquid cooling mechanisms are difficult to employ because of the non-coplanarity of the circuit chips or modules. Accordingly, a dimensionally compliant cooling system for such circumstances must be provided.

SUMMARY OF THE INVENTION

Accordingly, in a preferred solution to the above-described problem, there is disclosed a compliant thermal buss with a thermal heat pipe bridge. Furthermore, the proposed cooling device includes a heat pipe which is used to carry heat to a liquid cold plate at a remote location. In accordance with a preferred embodiment of the present invention, a cooling device comprises a pair of heat pipes together with a thermal conductor bridge plate to which the heat pipes are attached and affixed in a spaced-apart configuration. At least one of the heat pipes possesses a portion that extends beyond the bridging plate. It is to this extended portion that at least one flexible flap thermal conductor is attached to at least one of the heat pipes along a single edge of the flexible flap. In one preferred embodiment of the present invention, there are two such flaps. These flaps extend from heat pipe portions and include one or more flexible portions. It is the flexibility in these flap portions which permit contact with circuit chip modules which may be attached in a non-coplanar configuration.

Accordingly, it is an object of the present invention to provide an apparatus for cooling electronic circuit chips and modules.

It is also an object of the present invention to provide a mechanism for cooling electronic circuit chips and devices and modules which are disposed on circuit boards which are in turn arranged in close proximity to one another.

It is an additional object of the present invention to provide cooling devices in circumstances in which heat sinks and/or liquid cold plates are too thick or inconvenient to employ.

It is a further object of the present invention to provide a mechanism for cooling electronic circuit devices which are disposed at some distance from significant heat sink mechanisms.

It is yet another object of the present invention to provide a mechanism for cooling electronic circuit chips and/or modules which are disposed on circuit boards in non-coplanar configurations.

It is a further object of the present invention to be able to operate electronic circuit chip devices at high power levels and/or at higher frequencies to achieve better performance.

Lastly, but not limited to, it is a purpose of the present invention to provide a mechanism for more efficient cooling of electronic circuit devices and chips in systems supplying heat pipes.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
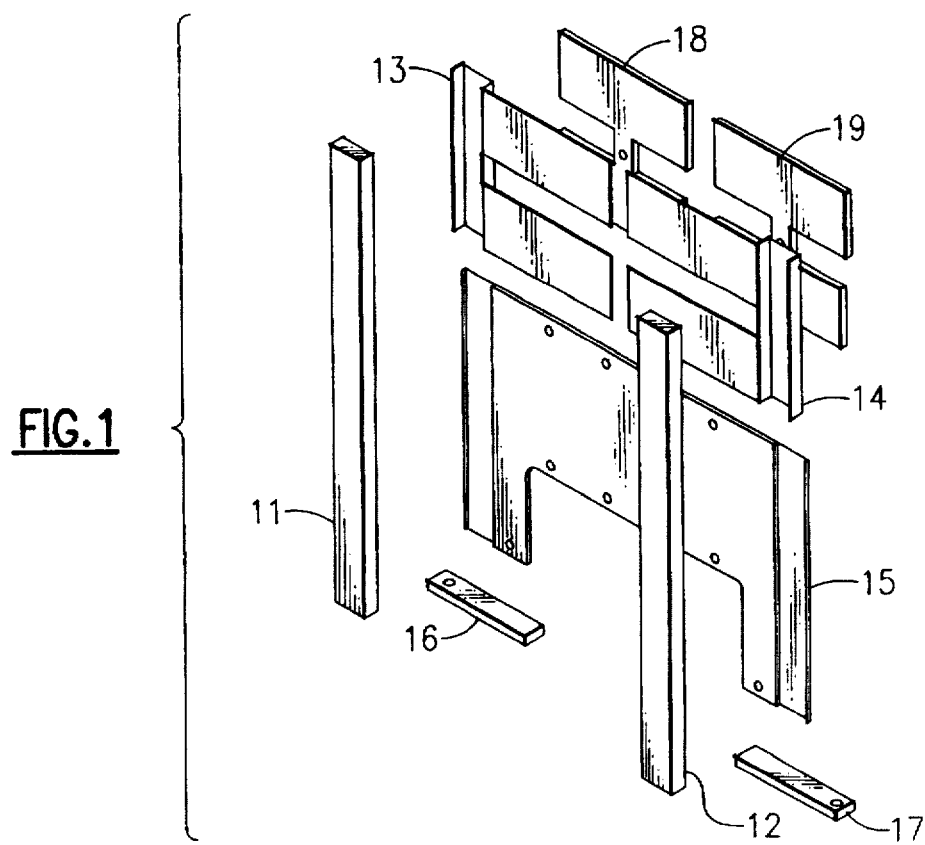
FIG. 1 is an exploded view of an apparatus in accordance with the present invention.

In accordance with a preferred embodiment of the present invention, a cooling device for use with electronic circuit boards, particularly ones that are closely spaced together, is shown in an exploded view of FIG. 1. In particular, the preferred embodiment of this invention includes heat pipes 11 and 12 which are maintained in a fixed spaced-apart position and orientation by means of bridging plate 15. The ends of heat pipes 11 and 12, respectively, are attached to pedestals 16 and 17, respectively, which are preferably directly connected to a fluid-cooled cold plate, the preferable cooling fluid (for the present case) being water. Most importantly, for the present invention, attached to heat pipes 11 and 12 are flexible conductive flaps 13 and 14, respectively. To provide an additional heat conduction mechanism, H-shaped heat spreader plates 18 and 19 are provided. Flexible conductor flaps 13 and 14 are preferably comprised of copper strap material measuring 20 mils or less in thickness to ensure compliance. Spreader plates 18 and 19 are preferably comprised of aluminum with a thickness of approximately 90 mils. Heat pipes 11 and 12 and flaps 13 and 14, respectively, are joined together by solder or with a thermally conductive epoxy. Flexible conductive copper flaps 13 and 14 provide one heat flow path between module heat sources and the heat pipes. A second parallel heat flow path is provided by spreader plates 18 and 19 which, thus, thermally augment flexible flaps 13 and 14, respectively. Compliance is accomplished by providing short sections of copper flap material which bridge the difference between the edge of the spreader plate and the heat pipe. The rigid spreader plates 18 and 19 serve as a secondary thermal flow path by providing a member through which heat is directed to heat pipes 11 and 12 and, thus, to pedestal 16 and 17 which attach to one or more heat sinks.

Figure 2:
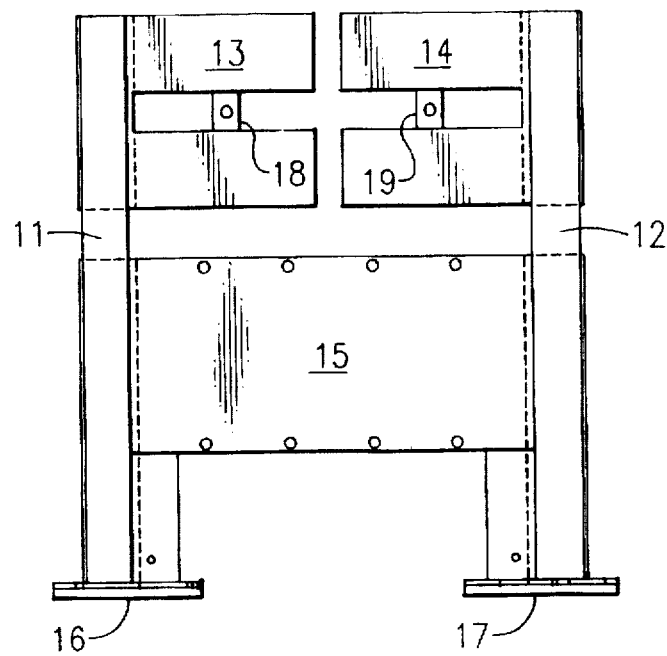
FIG. 2 is a front view of an apparatus of the present invention showing the exploded parts from FIG. 1 in their assembled configuration.

Bridging plate 15 preferably comprises a thermally conductive material such as copper. Bridging plate 15 also preferably includes channels into which heat pipes 11 and 12 are disposed, as shown in FIGS. 1 and 2. Similar channels are also employed in flexible conductive flaps 13 and 14. These flaps which may include several different portions extending inwardly from a heat pipe to provide a mechanism for compliant attachment for improved thermal contact with chips or modules. Spreader plates 18 and 19 also preferably possess central screw hole openings which permit the apparatus to be screwed tightly against a circuit board, thus providing even more intimate contact between the flaps and the chips to be cooled. While the device shown in FIGS. 1 and 2 possesses two heat pipes, it is noted that it is possible to construct versions of the present invention with only one heat pipe or with different numbers of conductor flaps. Preferred embodiments of the present invention include pedestals 16 and 17 which preferably comprise copper. Flexible conductive flaps 13 and 14 also preferably comprise copper and spreader plates 18 and 19 preferably comprise material such as aluminum. However, in general, any conductive material, especially a metal, may be employed as appropriate. Also, it is noted that spreader plates 18 and 19 preferably extend as closely as possible to heat pipes 11 and 12, respectively.

Accordingly, from the above, it should be appreciated that all the objects of the invention cited have, in fact, been achieved by the apparatus shown in FIGS. 1 and 2. In particular, it is seen that one now possesses a cooling device structure which is readily disposed between circuit boards and which provides compliant and firmer contact with electronic circuit chips. It is further noted that heat from these chips may be conducted from these chips to a relatively remote heat sink by means of heat pipes.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A cooling device comprising:

a pair of heat pipes;

a thermally conductive bridging plate to which said heat pipes are attached in a fixed spaced-apart substantially parallel configuration, at least one of said heat pipes having a portion thereof which extends beyond said bridging plate; and at least one flexible flap thermal conductor attached to at least one of said heat pipes on a single edge of said flap and at a position along said extending heat pipe portion.

2. The device of claim 1 further including a liquid cold plate to which said heat pipes are affixed.

3. The device of claim 1 in which there are two flexible flap thermal conductors.

4. The device of claim 3 further including at least one spreader plate which is in thermal contact with said flaps without compromising their flexibility.

5. The device of claim 4 of which said spreader plate is in thermal contact with at least one of said heat pipes.

6. The device of claim 1 in which said bridging plate comprises material selected from the group consisting of copper and aluminum.

7. The device of claim 1 in which said at least one flexible flap thermal conductor comprises a material selected from the group consisting of copper and aluminum.

8. The cooling device of claim 1 further including pedestals attached at ends of said heat pipes which are located distally from said flexible flap thermal conductors.

\* \* \* \* \*